US012610765B2

(12) United States Patent
Lin

(10) Patent No.: US 12,610,765 B2
(45) Date of Patent: Apr. 21, 2026

(54) MANUFACTURING METHOD OF SEMICONDUCTOR DEVICE

(71) Applicant: NANYA TECHNOLOGY CORPORATION, New Taipei city (TW)

(72) Inventor: Yu Li Lin, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 332 days.

(21) Appl. No.: 18/241,882

(22) Filed: Sep. 3, 2023

(65) Prior Publication Data

US 2025/0079179 A1 Mar. 6, 2025

(51) Int. Cl.
| | |
|---|---|
| *H10P 50/00* | (2026.01) |
| *H10P 50/28* | (2026.01) |
| *H10P 76/20* | (2026.01) |
| *H10P 76/40* | (2026.01) |

(52) U.S. Cl.
CPC ............ *H10P 50/692* (2026.01); *H10P 50/00* (2026.01); *H10P 50/283* (2026.01); *H10P 50/691* (2026.01); *H10P 50/695* (2026.01); *H10P 50/71* (2026.01); *H10P 50/73* (2026.01); *H10P 76/204* (2026.01); *H10P 76/2041* (2026.01); *H10P 76/405* (2026.01); *H10P 76/4085* (2026.01)

(58) Field of Classification Search
None
See application file for complete search history.

(56) References Cited

U.S. PATENT DOCUMENTS

| | | | | |
|---|---|---|---|---|
| 2019/0326129 A1* | 10/2019 | Anderson | ............. | C07C 17/263 |
| 2022/0102142 A1* | 3/2022 | Lung | ................. | H01L 21/02164 |
| 2022/0301927 A1* | 9/2022 | Huang | ................ | H01L 21/0337 |

FOREIGN PATENT DOCUMENTS

TW 202312270 A 3/2023

OTHER PUBLICATIONS

A. Grill, "Diamond-like carbon: state of the art", Diamond and Related Materials, vol. 8, pp. 428-434. (Year: 1999).*

* cited by examiner

*Primary Examiner* — Jiong-Ping Lu
(74) *Attorney, Agent, or Firm* — CKC & Partners Co., LLC

(57) ABSTRACT

A manufacturing method of a semiconductor device includes depositing a first bilayer structure over a substrate, in which the first bilayer structure includes a silicon oxide layer and a silicon nitride layer over the silicon nitride layer; forming a first carbonaceous hard mask on the first bilayer structure; forming a second bilayer structure on the first carbonaceous hard mask; forming a mask stack of alternating anti-reflecting coating (ARC) hard masks and second carbonaceous hard masks on the second bilayer structure; and coating a photoresist on the mask stack.

16 Claims, 20 Drawing Sheets

Figure 1:
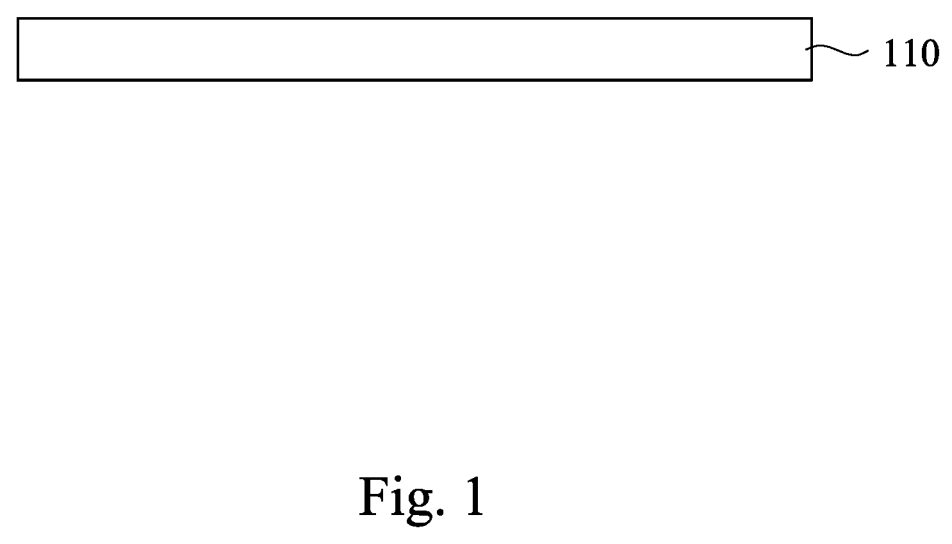

MANUFACTURING METHOD OF SEMICONDUCTOR DEVICE

BACKGROUND

Field of Disclosure

The present disclosure relates to a manufacturing method of a semiconductor device.

Description of Related Art

In the manufacturing of semiconductor device, the critical dimension of the device (i.e. the size of the device) became smaller and smaller as generations after generations of new device and process evolves. As a result, the side wall damage of the array active area becomes a major problem when the dimension of the device shrinks. Such damage will cause bit line-bit line leakage word line on worse, slow down the reading operation of the device and cause functional failure.

SUMMARY

One aspect of the present disclosure provides a manufacturing method of a semiconductor device.

According to some embodiments of the present disclosure, a manufacturing method of a semiconductor device includes depositing a first bilayer structure over a substrate, in which the first bilayer structure includes a silicon oxide layer and a silicon nitride layer over the silicon oxide layer; forming a first carbonaceous hard mask on the first bilayer structure; forming a second bilayer structure on the first carbonaceous hard mask; forming a mask stack of alternating anti-reflecting coating (ARC) hard masks and second carbonaceous hard masks on the second bilayer structure; and coating a photoresist on the mask stack.

In some embodiments of the present disclosure, the manufacturing method of the semiconductor device further includes patterning the photoresist; etching the mask stack; removing the photoresist; etching the second bilayer structure; and removing the mask stack.

In some embodiments of the present disclosure, the manufacturing method of the semiconductor device further includes etching the first carbonaceous hard mask; removing the second bilayer structure; etching the first bilayer structure; removing the first carbonaceous hard mask; etching the substrate; and removing the first bilayer structure.

In some embodiments of the present disclosure, the first carbonaceous hard mask includes diamond like carbonaceous hard mask.

In some embodiments of the present disclosure, the second bilayer structure include an α-silicon layer and a silicon oxide layer over the α-silicon layer.

In some embodiments of the present disclosure, the layer of the mask stack that contacts the second bilayer structure is a second carbonaceous hard mask.

In some embodiments of the present disclosure, forming the mask stack of alternating anti-reflecting coating (ARC) hard masks and second carbonaceous hard masks on the second bilayer structure includes forming a second carbonaceous hard mask on the second bilayer structure; forming a first ARC hard mask on the second carbonaceous hard mask; forming a third carbonaceous hard mask on the first ARC hard mask; and forming a second ARC hard mask on the third carbonaceous hard mask.

In some embodiments of the present disclosure, depositing the first bilayer structure includes depositing an oxide layer on the substrate; and depositing a nitride layer over the oxide layer.

Another aspect of the present disclosure provides a manufacturing method of a semiconductor device.

According to some embodiments of the present disclosure, a manufacturing method of a semiconductor device includes forming an oxide layer on a substrate; depositing a first bilayer structure over the oxide layer, in which the first bilayer structure includes a silicon oxide layer and a silicon nitride layer over the silicon oxide layer; forming a first carbonaceous hard mask on the first bilayer structure; forming a second bilayer structure on the first carbonaceous hard mask, in which the second bilayer structure includes an α-silicon layer and a silicon oxide layer over the α-silicon layer; and forming a stack of alternating anti-reflecting coating (ARC) hard masks and second carbonaceous hard masks on the second bilayer structure.

In some embodiments of the present disclosure, the manufacturing method of the semiconductor device further includes etching the mask stack; etching the second bilayer structure; and removing the mask stack.

In some embodiments of the present disclosure, the manufacturing method of the semiconductor device further includes etching the first carbonaceous hard mask; removing the second bilayer structure; etching the first bilayer structure; removing the first carbonaceous hard mask; etching the substrate; and removing the first bilayer structure.

In some embodiments of the present disclosure, the first carbonaceous hard mask includes diamond like carbonaceous hard mask.

In some embodiments of the present disclosure, the layer of the mask stack that contacts the second bilayer structure is a second carbonaceous hard mask.

In some embodiments of the present disclosure, forming the mask stack of alternating anti-reflecting coating (ARC) hard masks and second carbonaceous hard masks on the second bilayer structure includes forming a second carbonaceous hard mask on the second bilayer structure; forming a first ARC hard mask on the second carbonaceous hard mask; forming a third carbonaceous hard mask on the first ARC hard mask; and forming a second ARC hard mask on the third carbonaceous hard mask.

In some embodiments of the present disclosure, the manufacturing method of the semiconductor device further includes etching the oxide layer; and removing the oxide layer after etching the substrate.

Another aspect of the present disclosure provides a manufacturing method of a semiconductor device.

According to some embodiments of the present disclosure, a manufacturing method of a semiconductor device includes depositing a first bilayer structure over a substrate, in which the first bilayer structure includes a silicon oxide layer and a silicon nitride layer over the silicon oxide layer; depositing a second bilayer structure over the first bilayer structure, in which the second bilayer structure includes a α-silicon layer and a silicon oxide layer over the α-silicon layer; and depositing a hard mask stack of alternating ARC hard masks and carbonaceous hard masks on the second bilayer structure.

In some embodiments of the present disclosure, the manufacturing method of the semiconductor device further includes patterning the hard mask stack; patterning the second bilayer structure; and removing the hard mask stack.

In some embodiments of the present disclosure, the manufacturing method of the semiconductor device further includes patterning the first bilayer structure; removing the second bilayer structure; and patterning the substrate.

In some embodiments of the present disclosure, patterning the first bilayer structure further includes: patterning the silicon nitride layer; and patterning the silicon oxide layer.

In some embodiments of the present disclosure, patterning the second bilayer structure further includes patterning the silicon oxide layer; and patterning the α-silicon layer.

In the aforementioned embodiments of the present disclosure, since the first bilayer structure that includes silicon nitride and silicon oxide is used in the manufacturing method of the semiconductor device, the oxide to nitride etching selectivity can help control the shape of the array active area, and thus reduce the side wall damage, improve tip to tip depth and side to side depth.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 to FIG. 19 are cross-sectional views of a semiconductor device at intermediate steps of the manufacturing method according to one embodiment of the present disclosure.

DETAILED DESCRIPTION

Figure 2:
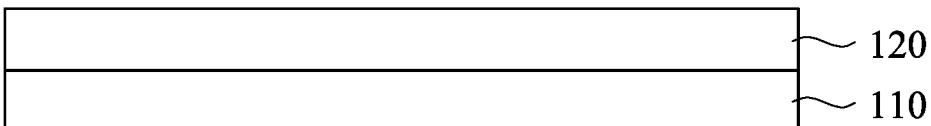

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the drawings. The spatially relative terms are intended to encompass different orientations of the device in use or operation in addition to the orientation depicted in the drawings. The apparatus may be otherwise oriented (rotated 90 degrees or at other orientations) and the spatially relative descriptors used herein may likewise be interpreted accordingly.

FIG. 1 to FIG. 19 are cross-sectional views of a semiconductor device at intermediate steps of the manufacturing method according to one embodiment of the present disclosure. Refer to FIG. 1 and FIG. 2, the manufacturing method of semiconductor device includes preparing a substrate 110. The material of the substrate 110 includes silicon, or other suitable material. Thereafter, forming an oxide layer 120 on the substrate 110. The oxide layer 120 is often referred to as the pad oxide layer, and can be formed using suitable deposition method.

Figure 3:
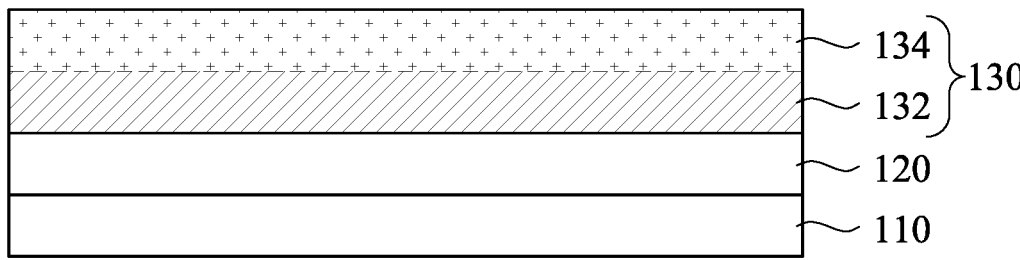

Refer to FIG. 3, thereafter, depositing a first bilayer structure 130 on the oxide layer 120, in which the first bilayer structure 130 includes a silicon oxide layer 132 and a silicon nitride layer 134. In some embodiments, depositing the first bilayer structure includes depositing a silicon oxide layer 132 on the substrate 110; and depositing a silicon nitride layer 134 over the silicon oxide layer 132. The first bilayer structure 130 is often referred to as an "oxide in-situ nitride (OSIN)" bilayer structure. It is formed by depositing the silicon oxide layer 132 in a chamber first using any suitable deposition method such as chemical vapor deposition (CVD), atomic layer deposition (ALD), or the like, and then depositing the silicon nitride layer 134 in the same chamber using any suitable deposition method such as chemical vapor deposition (CVD), atomic layer deposition (ALD), or the like. The two different kinds of material of the first bilayer structure 130 can help using the etch selectivity between silicon nitride and silicon oxide to further control the etching process, which will be discuss herein.

Figure 4:
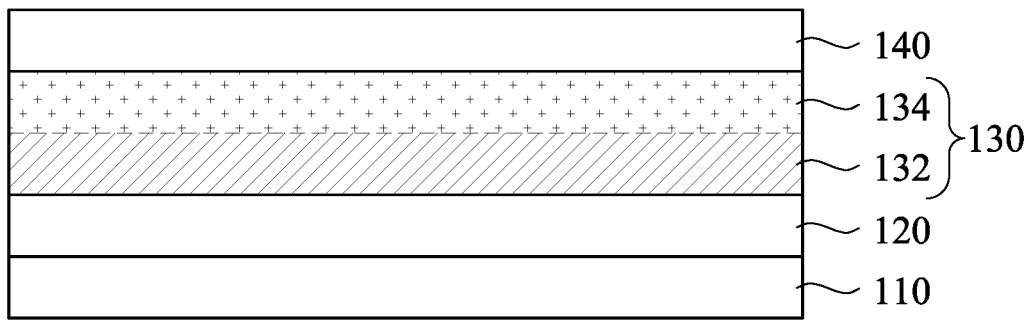
Figure 5:
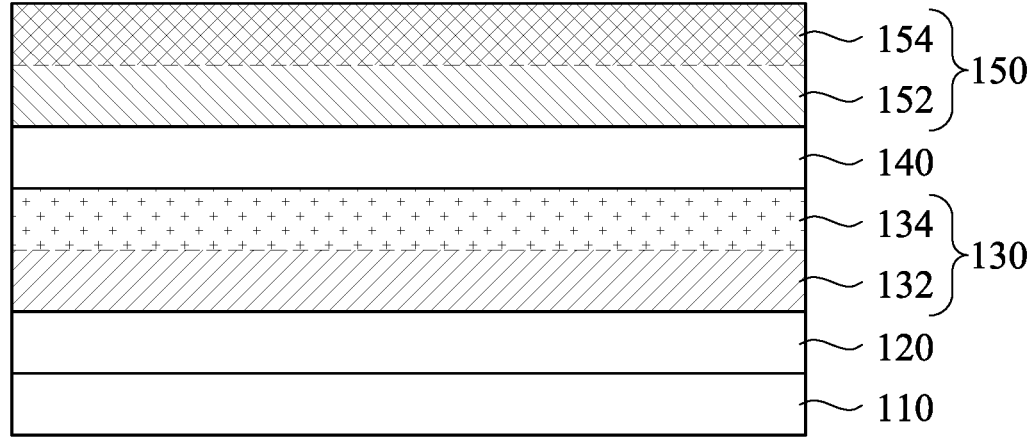

Refer to FIG. 4 and FIG. 5, thereafter, forming a first carbonaceous hard mask 140 on the first bilayer structure 130. Thereafter, forming a second bilayer structure 150 on the first carbonaceous hard mask 140. The first carbonaceous hard mask 140 includes diamond like carbonaceous (DLC) hard mask. The second bilayer structure 150 includes an α-silicon layer 152 and an silicon oxide layer 154. The second bilayer structure 150 is often referred to as an "α-silicon in-situ oxide" bilayer structure. It is formed by depositing the α-silicon layer 152 in a chamber first using any suitable deposition method such as chemical vapor deposition (CVD), atomic layer deposition (ALD), or the like, and then depositing the silicon oxide layer 154 in the same chamber using any suitable deposition method such as chemical vapor deposition (CVD), atomic layer deposition (ALD), or the like.

Figure 6:
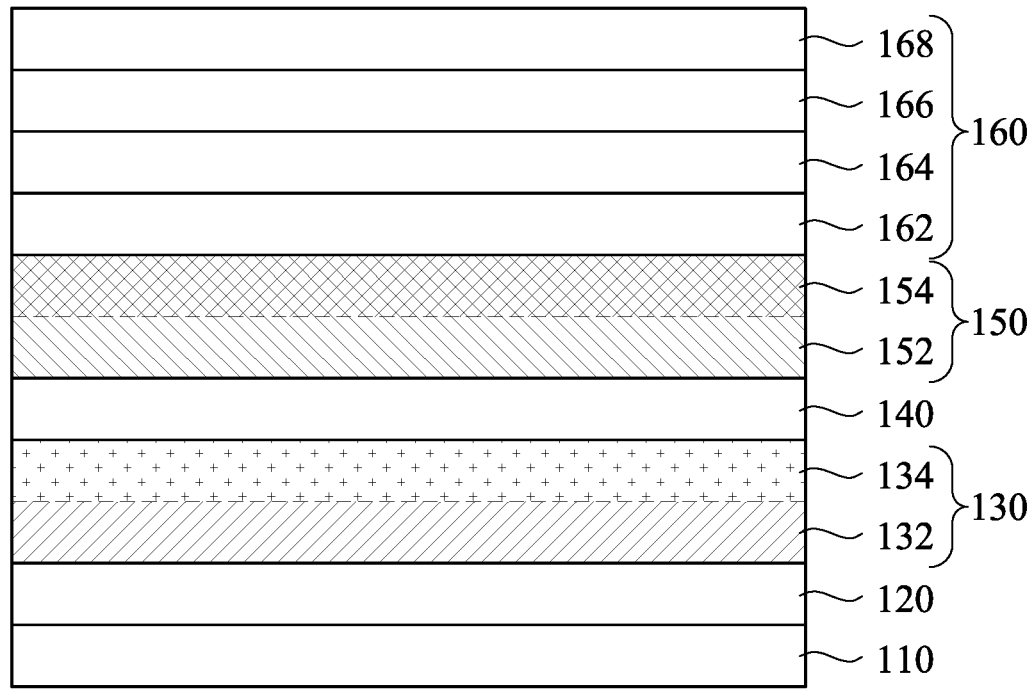
Figure 7:
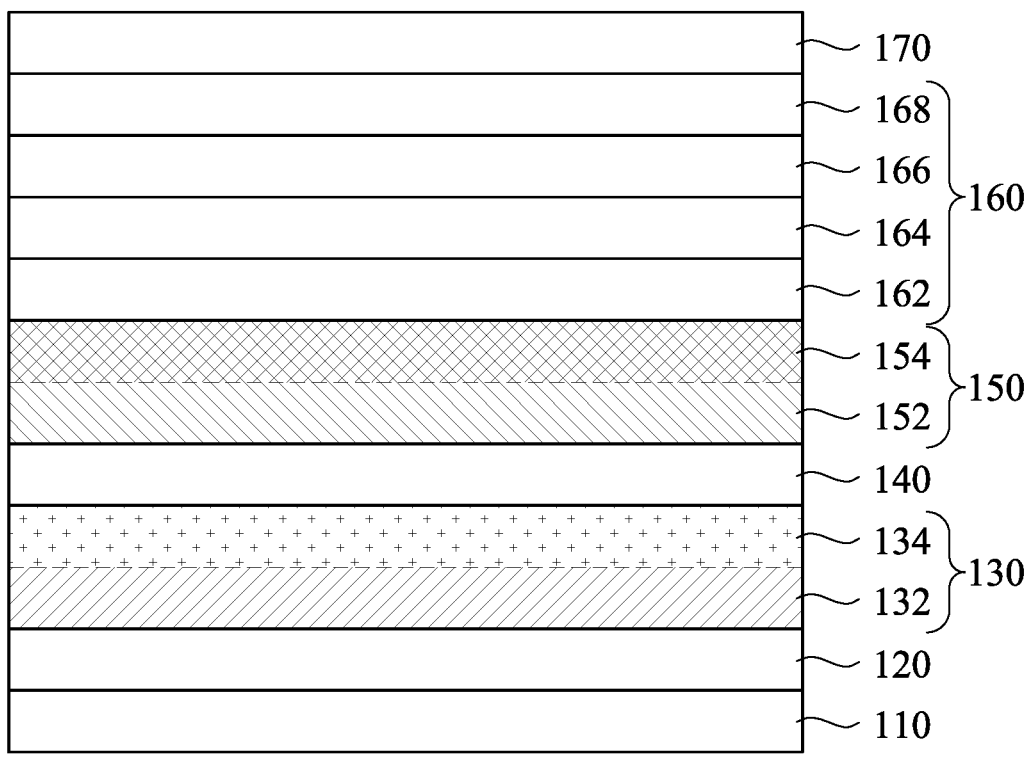

Refer to FIG. 6 and FIG. 7, thereafter; forming a stack 160 of alternating Anti-Reflecting Coating (ARC) hard masks 164, 168 and second carbonaceous hard masks 162, 166 on the second bilayer structure 150. This step includes forming a second carbonaceous hard mask 162 on the second bilayer structure 150; forming a first ARC hard mask 164 on the second carbonaceous hard mask 162; forming a third carbonaceous hard mask 166 on the first ARC hard mask 164; and forming a second ARC hard mask 168 on the third carbonaceous hard mask 166. In other words, the layer of the mask stack 160 that contacts the second bilayer structure 150 is a second carbonaceous hard mask 162. Thereafter, coating a photoresist 170 on the mask stack 160. In other words, the photoresist directly contacts the second ARC hard mask 168 of the mask stack 160.

Figure 8:
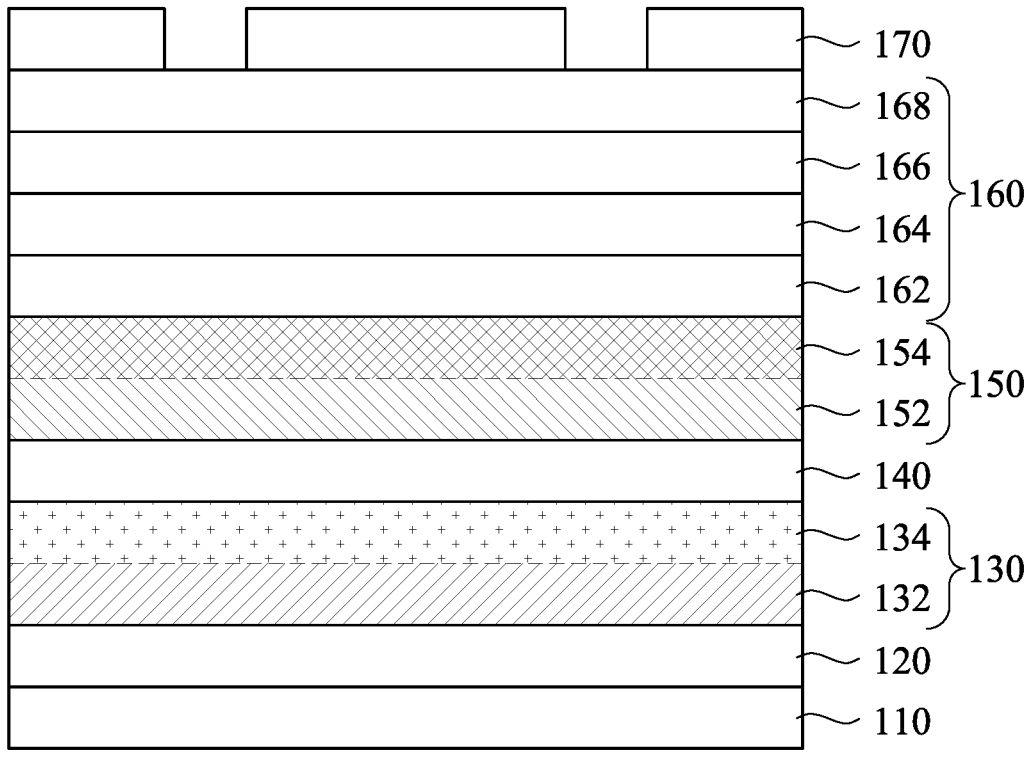
Figure 9:
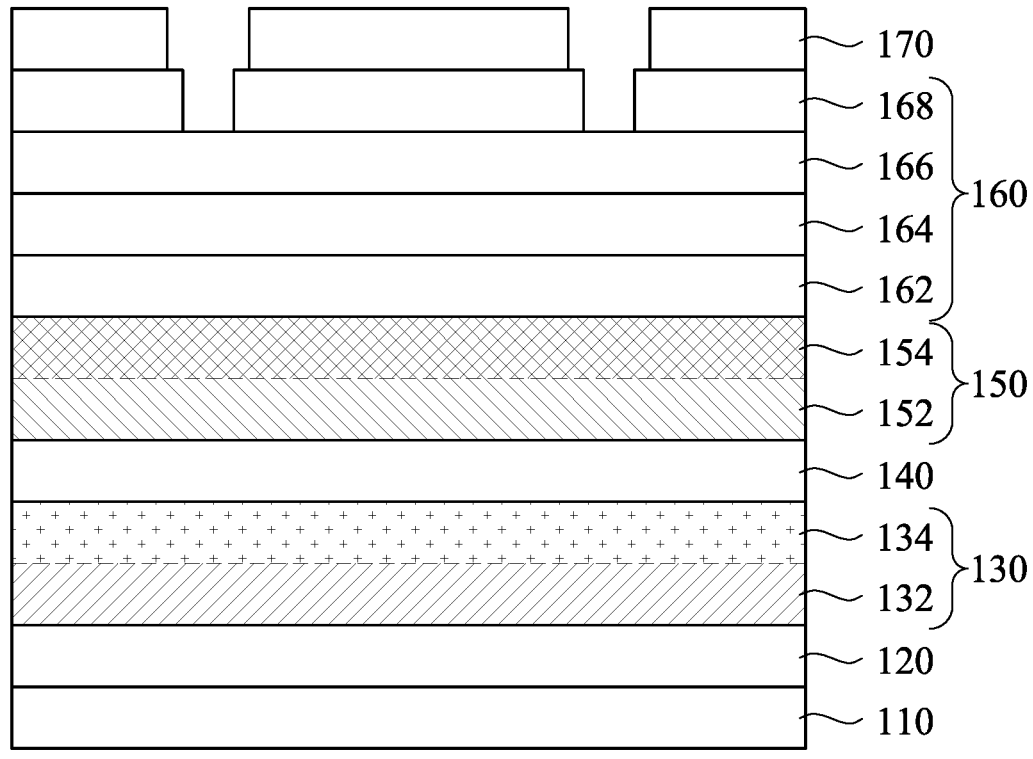
Figure 10:
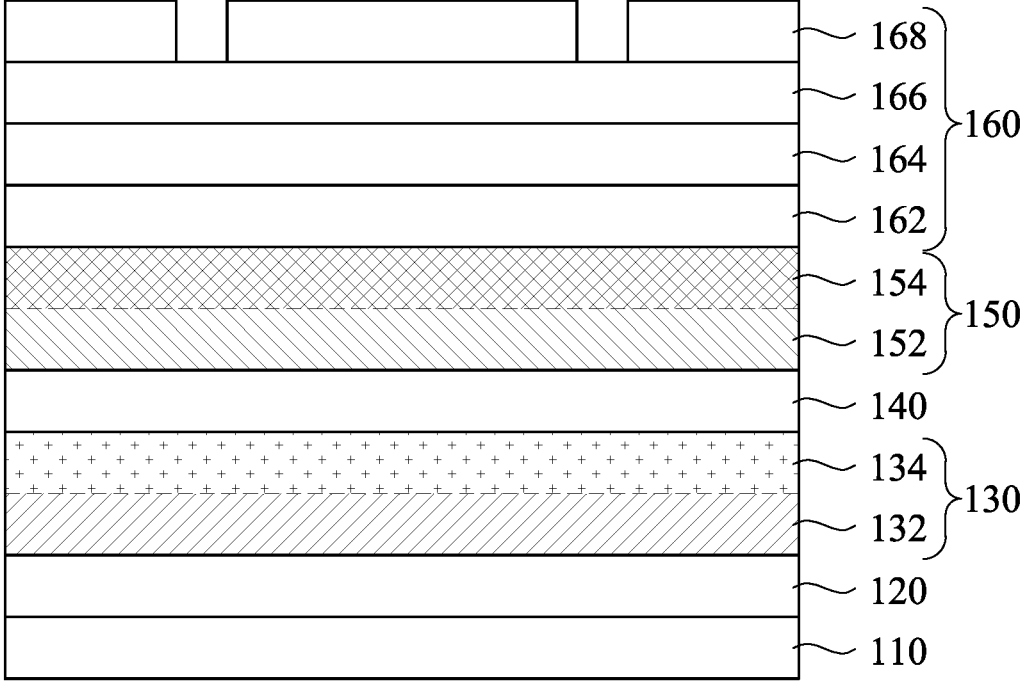

Refer to FIG. 8 to FIG. 10, thereafter, pattering the photoresist 170. In here, the term "patterning" can refer to steps such as exposure, developing and etching. Thereafter, pattering the mask stack 160 with the photoresist 170. In here, each layer of the mask stack 160 won't be patterned at the same time, but will be patterned using the upper layer as the mask, such that one layer will be patterned at a time. The patterning of the mask stack 160 will be discussed in FIG. 11. Thereafter, removing the photoresist 170.

Figure 11:
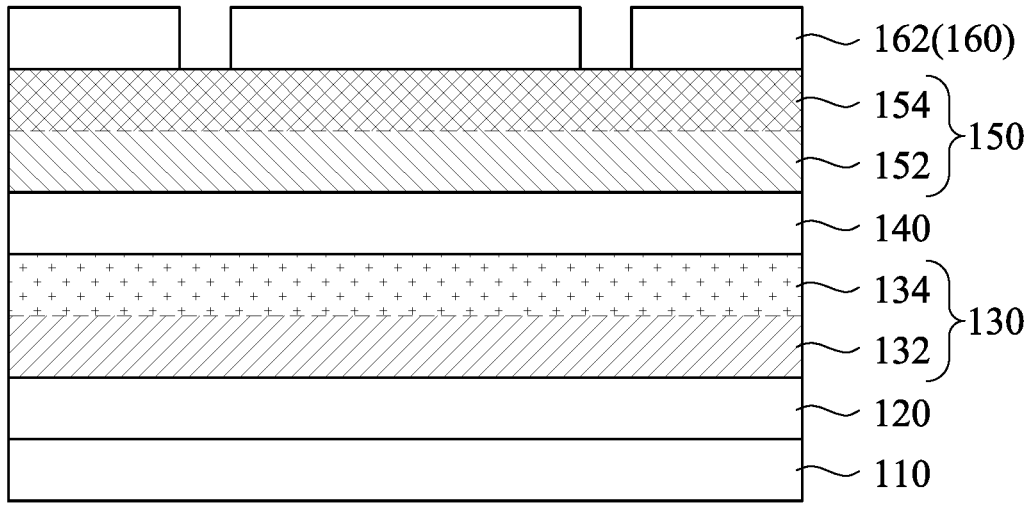

Refer to FIG. 11, thereafter, pattering the mask stack 160 layer by layer. As an example, after patterning the second ARC hard mask 168 in FIG. 10, the second ARC hard mask 168 will be used as the mask to pattern the third carbonaceous hard mask 166. After patterning the third carbonaceous hard mask 166, the second ARC hard mask 168 will be removed. The process continues until the last layer of the mask stack 160 is left, which is the second carbonaceous hard mask 162. This process has two particular purposes: to align the array active area and to shrink the critical dimension. During the process of repetitive patterning, the line width of the device can be smaller and smaller in each step, but the disclosure is not limited to this. The second carbonaceous hard mask 162 will be used as hard mask in the process later on. The removing of the second ARC hard mask 168, the third carbonaceous hard mask 166, the first ARC hard mask 164 (and the second carbonaceous hard mask 162 later on) can be process through a chemical-mechanical polishing (CMP) method, a dry etching method or a wet etching method, or other suitable method.

Figure 12:
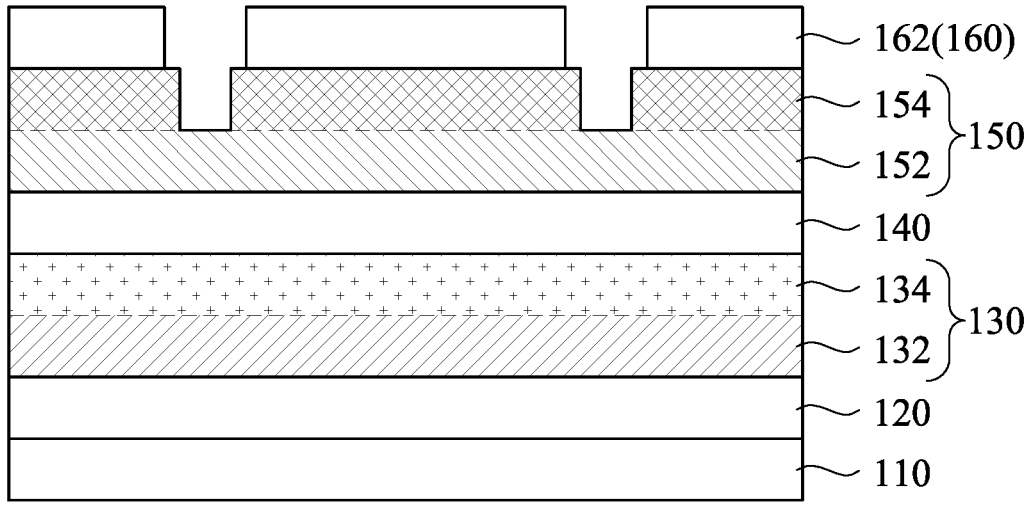

Refer to FIG. 12, thereafter, using the second carbonaceous hard mask 162 as the hard mask to etch the silicon oxide layer 154 of the second bilayer structure 150. This process can be done using a dry etching method, a reactive ion etching method, or other suitable method. Afterwards, in some embodiments, the second carbonaceous hard mask 162 will be removed. In other embodiments, it serves as the hard mask of the succeeding patterning process.

Figure 13:
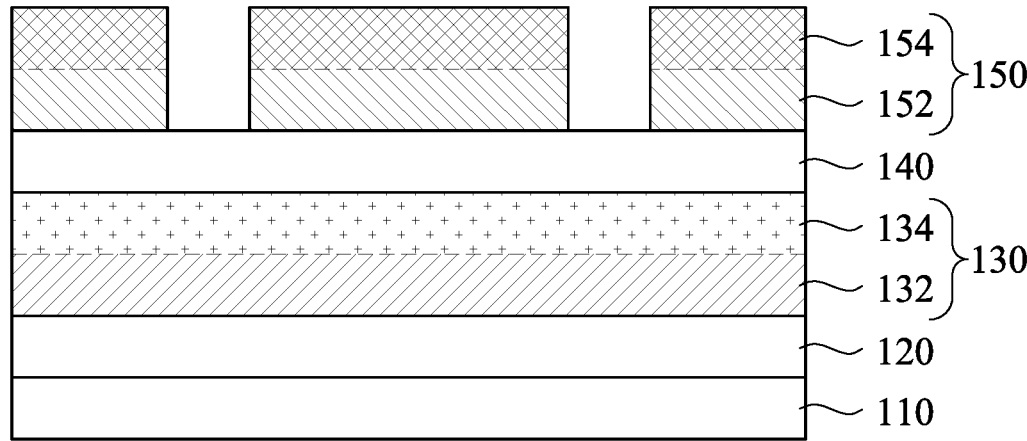

Refer to FIG. 13, thereafter, patterning the α-silicon layer 152 using the silicon oxide layer 154 (or the second carbonaceous hard mask 162) as a mask. In this particular step, the second bilayer structure 150 with two different kinds of material can make use of the etch selectivity of the two material of an etchant, such as a wet etchant, to control the region to be patterned. In this case, the etching process can be a wet etching process, a dry etching process, or any other suitable method.

Figure 14:
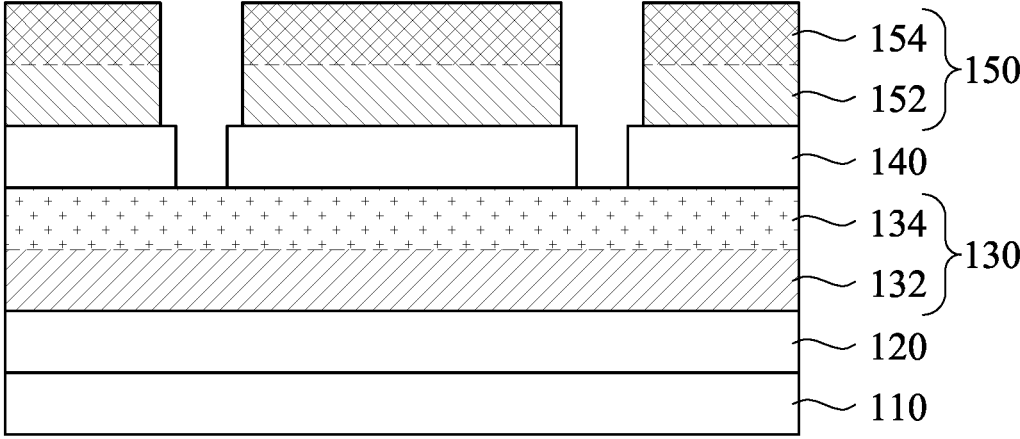

Refer to FIG. 14, thereafter, etching the first carbonaceous hard mask 140 using the second bilayer structure 150 as the mask. The step can further shrink the critical dimension of the device and align the array active area. After this step, the second bilayer structure 150 is removed. The remove process can be a CMP process, a dry etching process, a wet etching process or any suitable method.

Figure 15:
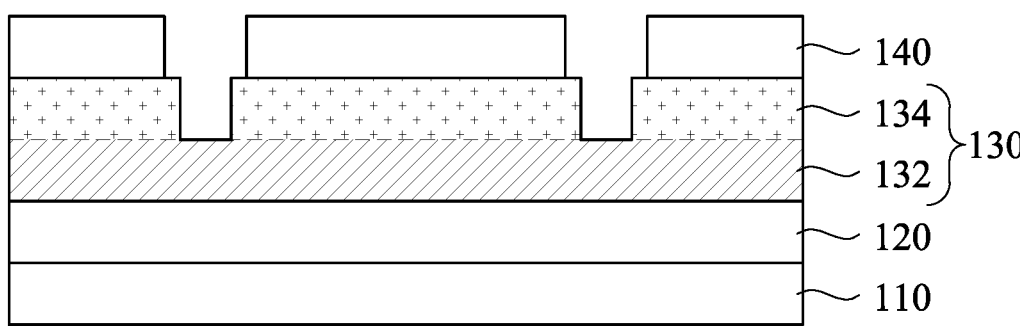
Figure 16:
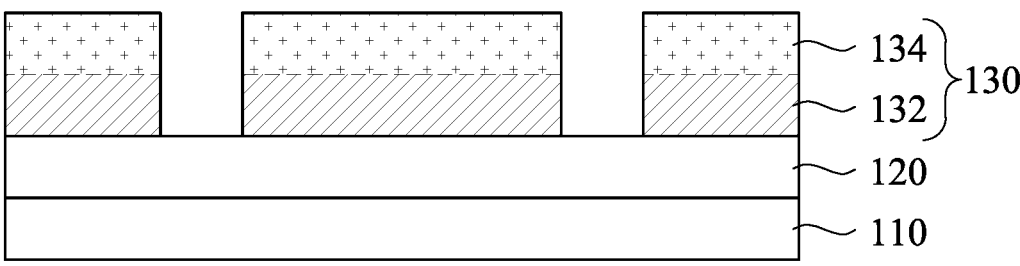

Refer to FIG. 15 and FIG. 16, thereafter, patterning the silicon nitride layer 134 of the first bilayer structure 130 using the first carbonaceous hard mask 140 as the mask. Thereafter, using the silicon nitride layer 134 of the first bilayer structure 130 as the mask to pattern the silicon oxide layer 132 of the first bilayer structure 130. The two patterning process can use different etching methods, such as dry etching for the silicon nitride layer 134 etching and wet etching for the silicon oxide layer 132 etching. Since the etching rate between silicon nitride and silicon oxide has great difference, when etching the silicon oxide layer 132, the etchant will not etch the silicon nitride layer too much, causing the opening of the silicon nitride layer 134 to further expand and damage the sidewall of the array active area.

Since the first bilayer structure 130 that includes silicon nitride and silicon oxide is used in the manufacturing method of the semiconductor device, the oxide to nitride etching selectivity can help control the shape of the array active area, and thus reduce the side wall damage, improve tip to tip depth and side to side depth.

Figure 17:
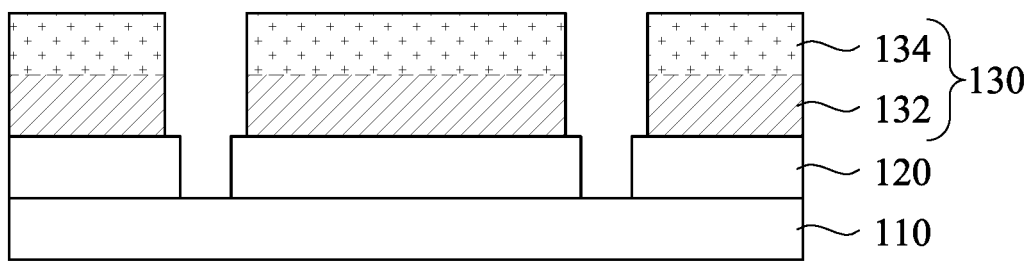

Refer to FIG. 17, thereafter, etching the oxide layer 120 using the first bilayer structure 130 as the mask. This step can further shrink the critical dimension of the semiconductor device. After this step, the first bilayer structure 130 is removed. The remove process can be a CMP process, a dry etching process, a wet etching process or any suitable method.

Figure 18:
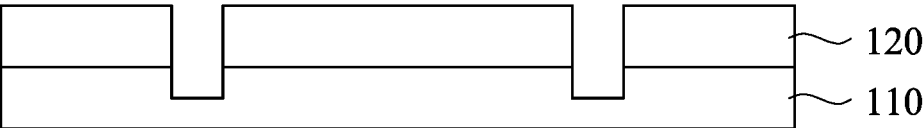
Figure 19:
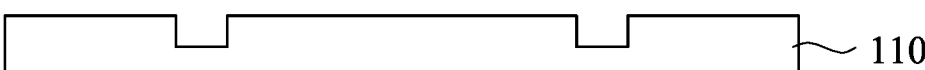
Figure 20:
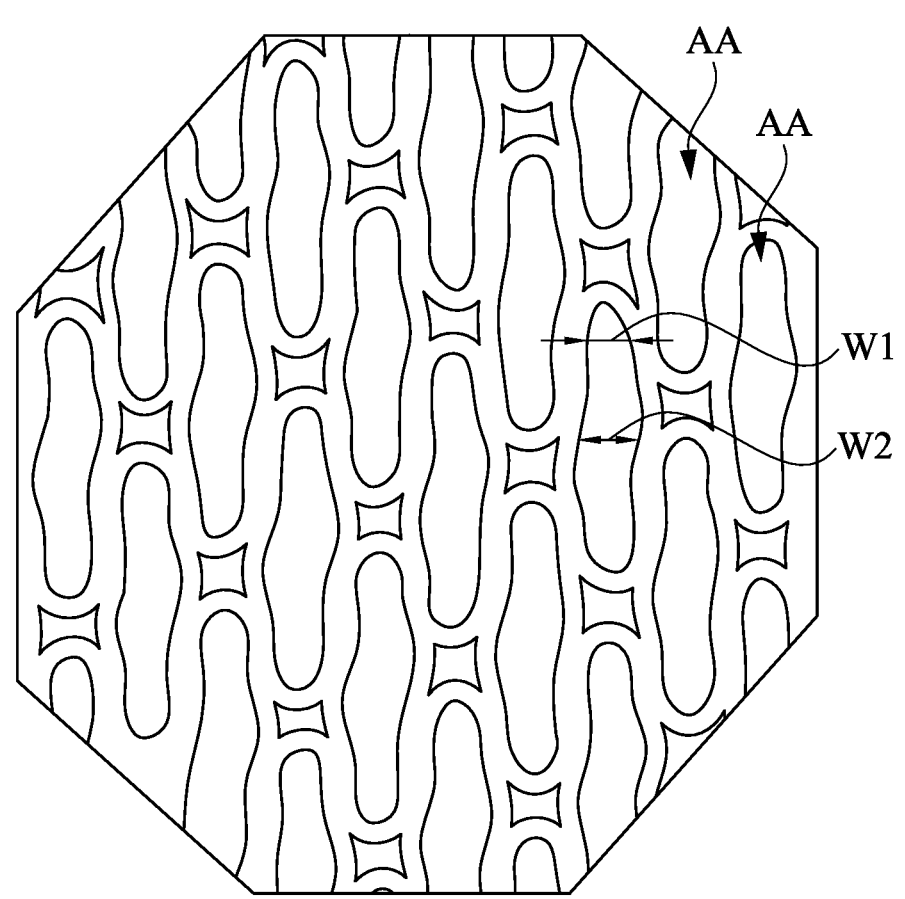
FIG. 20 is a top view of the semiconductor device of FIG. 19.

Refer to FIG. 18, FIG. 19 and FIG. 20, thereafter; patterning the substrate 110 to form the active area AA (see FIG. 20). After this step, the oxide layer 120 is removed, lefting the patterned substrate 110. FIG. 20 is a top view of the semiconductor device of FIG. 19. FIG. 20 shows the active area AA after patterning. In some embodiments, the tip width W1 of an active area AA is 17.1 nanometers, and the width W2 of an active area AA is 23.56 nanometers, but the disclosure is not limited in this scope.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method of a semiconductor device, comprising:

depositing a first bilayer structure over a substrate, wherein the first bilayer structure comprises a silicon oxide layer and a silicon nitride layer over the silicon oxide layer;

forming a first carbonaceous mask on the first bilayer structure;

forming a second bilayer structure on the first carbonaceous mask;

forming a mask stack of alternating anti-reflecting coating (ARC) masks and second carbonaceous masks on the second bilayer structure, comprising:

forming a second carbonaceous mask on the second bilayer structure;

forming a first ARC mask on the second carbonaceous mask;

forming a third carbonaceous mask on the first ARC mask; and forming a second ARC mask on the third carbonaceous mask; and coating a photoresist on the mask stack.

2. The manufacturing method of the semiconductor device of claim 1, further comprising:

patterning the photoresist;

etching the mask stack;

removing the photoresist;

etching the second bilayer structure; and removing the mask stack.

3. The manufacturing method of the semiconductor device of claim 2, further comprising:

etching the first carbonaceous mask;

removing the second bilayer structure;

etching the first bilayer structure;

removing the first carbonaceous mask;

etching the substrate; and removing the first bilayer structure.

4. The manufacturing method of the semiconductor device of claim 1, wherein the second bilayer structure comprises an α-silicon layer and a silicon oxide layer over the α-silicon layer.

5. The manufacturing method of the semiconductor device of claim 1, wherein a layer of the mask stack that contacts the second bilayer structure is a second carbonaceous mask.

6. The manufacturing method of the semiconductor device of claim 1, wherein depositing the first bilayer structure comprises:

depositing an oxide layer on the substrate; and
depositing a nitride layer over the oxide layer.

7. A manufacturing method of a semiconductor device, comprising:
   forming an oxide layer on a substrate;
   depositing a first bilayer structure over the oxide layer, wherein the first bilayer structure comprises a silicon oxide layer and a silicon nitride layer over the silicon oxide layer;
   forming a first carbonaceous mask on the first bilayer structure;
   forming a second bilayer structure on the first carbonaceous mask, wherein the second bilayer structure comprises an α-silicon layer and an silicon oxide layer over the α-silicon layer; and
   forming a mask stack of alternating anti-reflecting coating (ARC) masks and second carbonaceous masks on the second bilayer structure, comprising:
      forming a second carbonaceous mask on the second bilayer structure;
      forming a first ARC mask on the second carbonaceous mask;
      forming a third carbonaceous mask on the first ARC mask; and
      forming a second ARC mask on the third carbonaceous mask.

8. The manufacturing method of the semiconductor device of claim 7, further comprising:
   etching the mask stack;
   etching the second bilayer structure; and
   removing the mask stack.

9. The manufacturing method of the semiconductor device of claim 8, further comprising:
   etching the first carbonaceous mask;
   removing the second bilayer structure;
   etching the first bilayer structure;
   removing the first carbonaceous mask;
   etching the substrate; and
   removing the first bilayer structure.

10. The manufacturing method of the semiconductor device of claim 7, wherein a layer of the mask stack that contacts the second bilayer structure is a second carbonaceous mask.

11. The manufacturing method of the semiconductor device of claim 7, further comprising:
   etching the oxide layer; and
   removing the oxide layer after etching the substrate.

12. A manufacturing method of a semiconductor device, comprising:
   depositing a first bilayer structure over a substrate, wherein the first bilayer structure comprises a silicon oxide layer and a silicon nitride layer over the silicon oxide layer;
   depositing a second bilayer structure over the first bilayer structure, wherein the second bilayer structure comprises a α-silicon layer and a silicon oxide layer over the α-silicon layer; and
   depositing a mask stack of alternating ARC masks and carbonaceous masks on the second bilayer structure, comprising:
      forming a second carbonaceous mask on the second bilayer structure;
      forming a first ARC mask on the second carbonaceous mask;
      forming a third carbonaceous mask on the first ARC mask; and
      forming a second ARC mask on the third carbonaceous mask.

13. The manufacturing method of the semiconductor device of claim 12, further comprising:
   patterning the mask stack;
   patterning the second bilayer structure; and
   removing the mask stack.

14. The manufacturing method of the semiconductor device of claim 13, further comprising:
   patterning the first bilayer structure;
   removing the second bilayer structure; and
   patterning the substrate.

15. The manufacturing method of the semiconductor device of claim 14, wherein patterning the first bilayer structure further comprises:
   patterning the silicon nitride layer; and
   patterning the silicon oxide layer.

16. The manufacturing method of the semiconductor device of claim 14, wherein patterning the second bilayer structure further comprises:
   patterning the silicon oxide layer; and
   patterning the α-silicon layer.

* * * * *